United States Patent [19]
Nishimura et al.

[11] Patent Number: 5,860,178
[45] Date of Patent: Jan. 19, 1999

[54] SUBSTRATE SPIN CLEANING APPARATUS

[75] Inventors: Joichi Nishimura; Tadashi Sasaki, both of Kyoto, Japan

[73] Assignee: Dainippon Screen Mfg. Co. Ltd., Japan

[21] Appl. No.: 625,644

[22] Filed: Mar. 29, 1996

[30] Foreign Application Priority Data

Apr. 3, 1995 [JP] Japan ................................. 7-102973

[51] Int. Cl.⁶ .................................................. A46B 13/04
[52] U.S. Cl. ................................ 15/77; 15/88.2; 15/102; 73/862.541
[58] Field of Search ........................... 15/21.1, 77, 88.2, 15/97.1, 102; 73/862.541

[56] References Cited

U.S. PATENT DOCUMENTS

| | | | |
|---|---|---|---|
| 4,935,981 | 6/1990 | Ohtani et al. | 15/88.2 |
| 5,345,639 | 9/1994 | Tanoue et al. | 15/77 |
| 5,351,360 | 10/1994 | Suzuki et al. | 15/77 |
| 5,475,889 | 12/1995 | Thrasher et al. | 15/77 |
| 5,636,401 | 6/1997 | Yonemizu et al. | 15/77 |
| 5,647,083 | 7/1997 | Sugimoto et al. | 15/77 |

FOREIGN PATENT DOCUMENTS

| | | |
|---|---|---|
| 63-16626 | 1/1988 | Japan ........................................ 15/77 |
| 1107159 | 7/1989 | Japan . |
| 352228 | 3/1991 | Japan . |

Primary Examiner—Terrence Till
Attorney, Agent, or Firm—Ostrolenk, Faber, Gerb & Soffen, LLP

[57] ABSTRACT

A substrate supporting device has a turntable mounted on a rotary shaft for supporting a substrate and spinning the substrate about a vertical axis. The turntable is replaceable by a load measuring device including a load meter mounted on a support bracket having a tube attachable to the rotary shaft. The load meter receives a cleaning brush to measure a pressing load applied therefrom. The load meter has a pressure sensor with an upper surface thereof at an equal level to the surface of the substrate to be placed on the substrate supporting device. Thus, a pressure to be applied to the substrate is measured in the same position as where the substrate is actually treated.

11 Claims, 7 Drawing Sheets

SUBSTRATE SPIN CLEANING APPARATUS

BACKGROUND OF THE INVENTION

1. Field of the Invention

The present invention relates to a substrate spin cleaning method and apparatus for cleaning semiconductor wafers, glass substrates for photomasks, glass substrates for liquid crystal displays, substrates for optical disks and the like, in which a cleaning liquid such as deionized water is supplied to a surface of a substrate spun about a vertical axis. The invention relates also to a method of measuring a pressure of a cleaning device in such a substrate spin cleaning apparatus.

2. Description of the Related Art

Conventional substrate spin cleaning apparatus are disclosed in Japanese Utility Model Publication (Unexamined) No. 1-107129 and Japanese Patent Publication (Unexamined) No. 3-52228, for example. In these conventional apparatus, a cleaning liquid is supplied to the surface of a substrate spun about a vertical axis, and a cleaning device (e.g. a cleaning or scrubbing brush) is moved over the substrate surface. The cleaning device contacts the substrate under a predetermined pressure to remove particles and impurities from the substrate surface. The particles and impurities removed are caused to flow with the cleaning liquid outwardly from the substrate by the centrifugal force due to the spin of the substrate.

To displace the cleaning device horizontally over the substrate surface, an arm having the cleaning device is rigidly attached to a support shaft rotatable about a vertical axis. A motor or the like is operatively connected to the support shaft to rotate the support shaft, thereby to displace the cleaning device horizontally over the substrate surface.

The support shaft is vertically movable to move the cleaning device, in combination with the rotation of the support shaft, between a position for cleaning the substrate and a position upward therefrom and between a cleaning position on the substrate and a retracted position displaced from the substrate. Further, the vertical movement of the support shaft is utilized to set the cleaning device relative to the substrate. In this instance, the operator checks to ensure an appropriate contact between the substrate and the cleaning device by adjusting an amount of the depression of the cleaning device upon the substrate according to the type of layer formed on the substrate (e.g. aluminum, oxide, nitride, polysilicon, patterned or bare silicon layer) and the property or type of contaminant adhering to the substrate.

In the conventional apparatus, the cleaning device in the cleaning position is at a fixed height. The pressure applied from the cleaning device to the substrate is determined once and for all, based on the height of the cleaning device fixed by an initial setting.

Conventionally, the pressure applied to the substrate is adjusted by varying an amount of depression of the cleaning device upon the substrate. It has been difficult for different operators effecting this adjustment to set a constant amount of depression upon the substrate at all times. This causes such inconveniences that a slight difference in the setting results in a difference in cleaning performance and that the substrate surface could be damaged. Further, a difference may occur between the predetermined height of the cleaning device and the expected pressure applied to the substrate, which may depend on the type of cleaning device used, or may be due to variations arising from using attachment of the cleaning device or may be relative to the position between the cleaning device and a substrate supporting device. Such a difference also lowers cleaning performance.

SUMMARY OF THE INVENTION

An object of the present invention is to provide a simple method and construction for constantly applying a predetermined pressure to substrates, to realize constant cleaning performance.

Another object of the invention is to provide a simple method and construction for applying a predetermined pressure to substrates reliably.

Other objects of the invention will be apparent from the description of the preferred embodiments.

The above objects are fulfilled, according to the present invention, by a substrate spin cleaning method for effecting cleaning treatment of a substrate by supplying a cleaning liquid to the substrate supported by a substrate supporting device and spun about a vertical axis. The method comprises the steps of cleaning a surface of the substrate with a cleaning device, displacing the cleaning device horizontally over the surface of the substrate, vertically moving the cleaning device, supplying the cleaning liquid to positions of the surface of the substrate under cleaning treatment by the cleaning device, and measuring a pressing load applied from the cleaning device.

In the substrate spin cleaning method according to the present invention, a pressure to be applied from the cleaning device to the substrate under cleaning treatment is measured, and operating conditions such as a height of the cleaning device and a pressure applied thereto are determined when the pressure measured is at a desired pressure level. As a result, a desired pressure is applied from the cleaning device to the substrate in actual treatment, to improve cleaning performance.

The above substrate spin cleaning method may further comprise the step of causing a pressure sensor of a load measuring device located at a level equal to the surface of the substrate supported by the substrate supporting device to receive the cleaning device, thereby to measure a pressing load applied from the cleaning device.

According to this method, a pressure is measured at a level equal to the substrate surface in actual cleaning treatment. This feature enables a desired pressure to be applied from the cleaning device to the substrate during an actual cleaning operation, to promote the cleaning performance still further.

In another aspect of the invention, a substrate spin cleaning apparatus comprises a substrate supporting device for supporting a substrate and spinning the substrate about a vertical axis; a cleaning device for cleaning a surface of the substrate; a cleaner displacing device for displacing the cleaning device horizontally over the surface of the substrate; a cleaner raising and lowering device for vertically moving the cleaning device; a cleaning liquid supplying device for supplying a cleaning liquid to positions of the surface of the substrate under cleaning treatment by the cleaning device; and a load measuring device for receiving the cleaning device at a level equal to the surface of the substrate supported by the substrate supporting device, and measuring a pressing load applied from the cleaning device.

According to the present invention, a pressure applied to the substrate in actual treatment is measured at a level equal to the surface of the substrate. Then, operating conditions such as a height of the cleaning device and a pressure applied thereto are determined when the pressure measured is at a desired pressure level. As a result, a desired pressure is applied from the cleaning device to the substrate in actual treatment.

Thus, a simple construction for measuring a pressure at a a level equal to the substrate surface in actual cleaning treatment enables determination of operating conditions under which the pressure measured becomes a desired pressure, and under which the substrate is cleaned. It is now possible to apply a desired pressure from the cleaning device to the substrate in actual treatment, to improve cleaning performance.

In the spin cleaning apparatus according to the present invention, the load measuring device may include a support frame detachably attachable to a rotary shaft of the substrate supporting device, and a load meter mounted on the support frame.

With this construction, the support frame is attached to the rotary shaft of the substrate supporting device, and the load meter is mounted on the support frame, to measure a pressure applied to the substrate, in the same position where the substrate is actually cleaned. Then, operating conditions such as a height of the cleaning device and a pressure applied thereto are determined when the pressure measured is at a desired pressure level. As a result, a desired pressure is applied from the cleaning device to the substrate in actual treatment.

In this way, a desired pressure is applied, with greater assurance, from the cleaning device to the substrate in actual treatment, to further promote cleaning performance.

In a further aspect of the invention, there is provided a method of measuring a pressure of a cleaning device in a substrate spin cleaning apparatus having a substrate support device for supporting a substrate and spinning the substrate about a vertical axis, the cleaning device for cleaning a surface of the substrate, a cleaner displacing device for displacing the cleaning device horizontally over the surface of the substrate, a cleaner raising and lowering device for vertically moving the cleaning device, and a cleaning liquid supply device for supplying a cleaning liquid to positions of the surface of the substrate under cleaning treatment by the cleaning device. The method of measuring the pressure of the cleaning device. The method of measuring the pressure of the cleaning device comprises the following steps:

placing a load measuring device such that a pressure sensor thereof is located at a level equal to the surface of the substrate supported by the substrate support device; and causing the pressure sensor to receive the cleaning device, thereby to measure a pressing load applied from the cleaning device.

In the pressure measuring method according to the present invention, a pressure applied to the substrate in actual treatment is measured at a level equal to the surface of the substrate. Then, operating conditions such as the height of the cleaning device and the pressure applied thereto are determined when the pressure measured is at a desired pressure level. As a result, a desired pressure is applied from the cleaning device to the substrate in actual treatment. Thus, the simple method of measuring a pressure at a level equal to the substrate surface in actual cleaning treatment enables a desired pressure to be applied from the cleaning device to the substrate during an actual cleaning operation, to improve cleaning performance.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DETAILED DESCRIPTION OF THE PREFERRED EMBODIMENTS

Preferred embodiments of the present invention will be described hereinafter with reference to the drawings.

Figure 1:
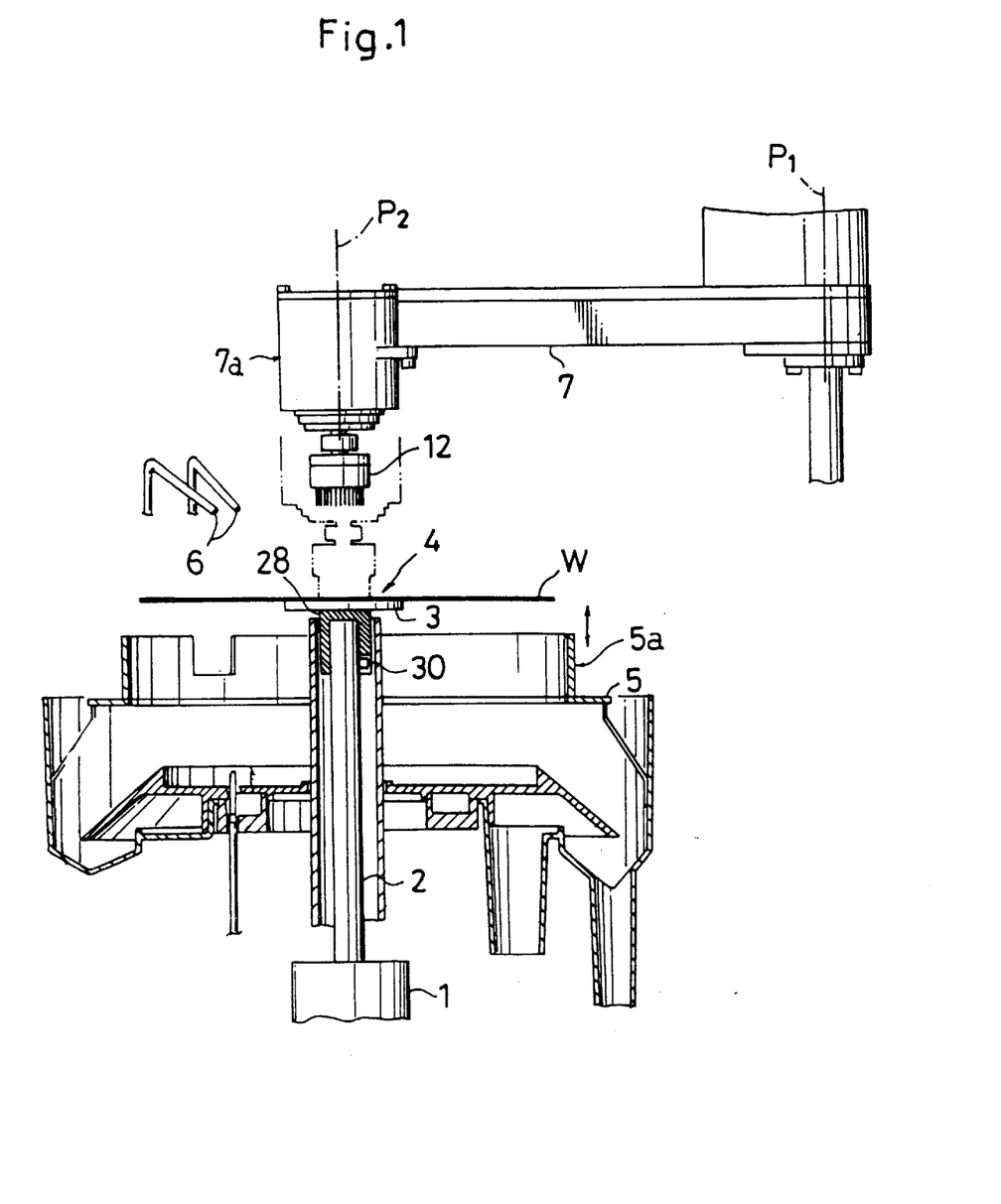
FIG. 1 is a schematic view in vertical section of a portion of a substrate spin cleaning apparatus in a first embodiment of the present invention.
Figure 2:
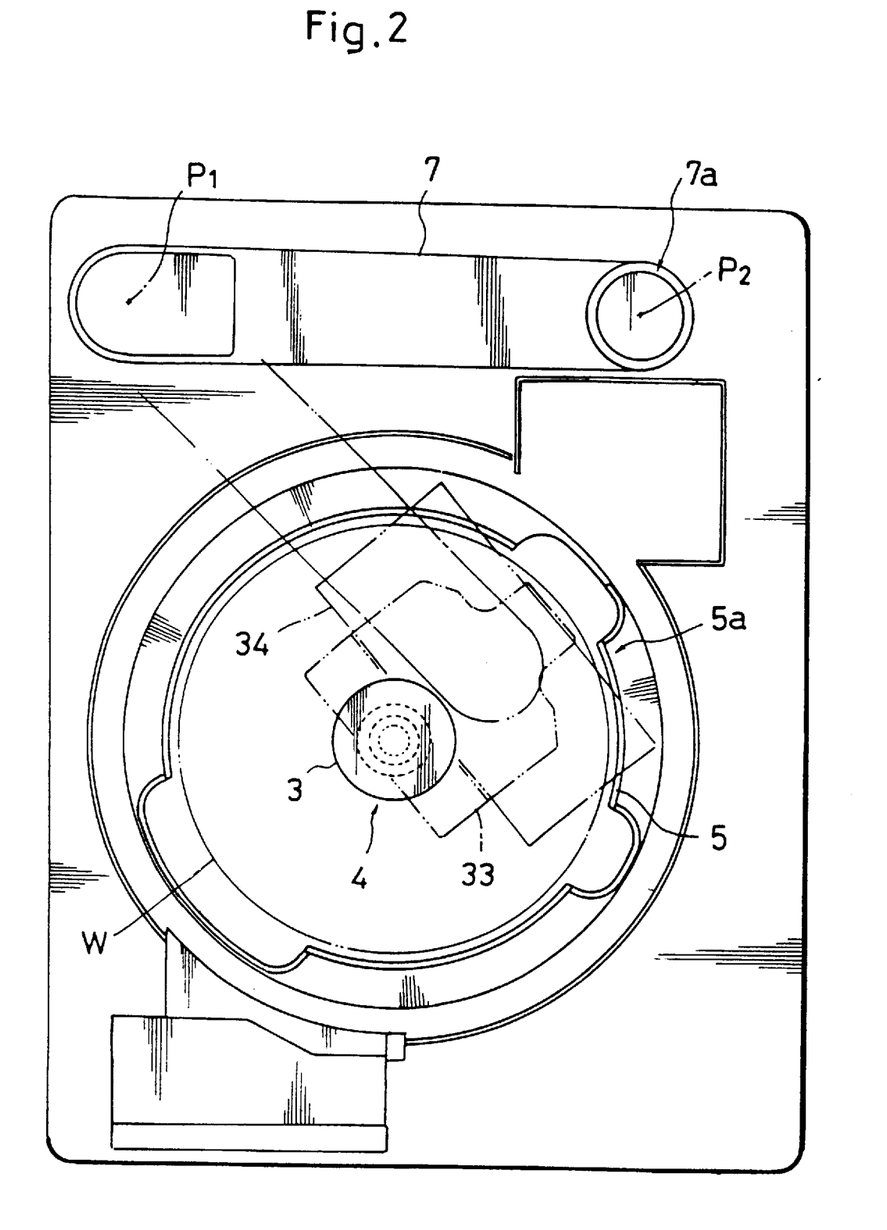
FIG. 2 is a plan view of the apparatus in the first embodiment.

As shown in FIGS. 1 and 2, a spin cleaning apparatus includes an electric motor 1 for rotating a rotary shaft 2 about a vertical axis. A turntable 3 is attached to the rotary shaft 2 to be rotatable therewith, for supporting a substrate or wafer W by vacuum suction. These components constitute a substrate supporting device 4 for supporting wafer W and spinning it about the vertical axis.

In this embodiment, the substrate supporting device 4 includes the turntable 3 of the suction-supporting type which, however, is not limiting. For example, the substrate supporting device 4 may include a plurality of substrate supporting elements arranged on the turntable 3 for supporting wafer W at peripheries thereof, with positioning pins mounted on the upper ends of the substrate supporting elements for determining a horizontal position of wafer W. In this case, wafer W is supported for spinning movement in a position spaced from the upper surface of the turntable 3.

The substrate supporting device 4 and wafer W thereby supported are surrounded by a cup 5 vertically movable by a lift mechanism (not shown). Nozzles 6 are arranged outwardly and circumferentially of the cup 5 to act as a cleaning liquid supplying device for delivering a cleaning liquid such as deionized water toward the center of wafer W.

Figure 3:
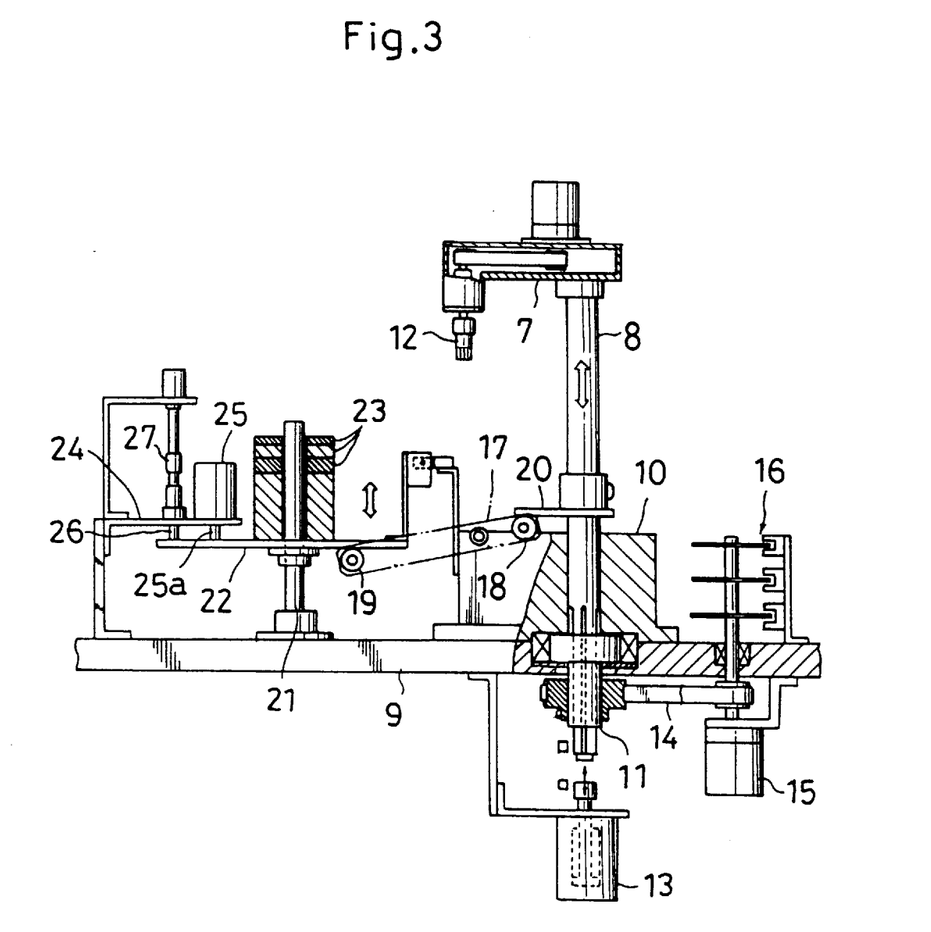
FIG. 3 is an overall side view of the apparatus in the first embodiment.

As shown in FIG. 3, an angle-shaped support arm 7 is disposed outside the cup 5 and supported by a rotatable support shaft 8. The support shaft 8 is vertically movably attached to a support block 10 mounted on a base 9. The support shaft 8 is supported by the support block 10 to be rotatable about a first vertical axis P1. Further, the support shaft 8 extends through to a rotatable sleeve 11 to be only vertically movable relative thereto, and the rotatable sleeve 11 is in turn supported by the base 9 to be only rotatable relative thereto. The support arm 7 includes a forward arm portion 7a (FIGS. 1 and 2) having a cleaning brush 12 attached to a lower end thereof to be rotatable about a second vertical axis P2 for cleaning the surface of wafer W.

An air cylinder 13 is disposed in an opposed relationship to a lower end of the support shaft 8 to act as a cleaner raising and lowering device. An electric motor 15 is operatively connected to the rotatable sleeve 11 through a belt 14. Numeral 16 in FIG. 3 denotes a position detecting mechanism for detecting positions of the cleaning brush 12, i.e. a position opposed to the center of wafer W, a position opposed to an outer periphery of wafer W and a standby position retracted outwardly of wafer W.

The support block 10 includes a balance arm 17 pivotable about a horizontal axis. The balance arm 17 has first and second contact rollers 18 and 19 disposed at opposite ends thereof.

The support shaft 8 includes a stopper plate 20 mounted in an intermediate position thereof. A post 21 erected on the base 9 supports a weight deck 22 which is vertically movable relative thereto. A plurality of weights 23 are stacked on the weight deck 22 with the post 21 extending therethrough. The first contact roller 18 is in contact with a lower surface of the stopper plate 20, while the second contact roller 19 is in contact with a lower surface of the weight deck 22. The weights 23 are slightly lighter than the support shaft 8, support arm 7 and cleaning brush 12.

The base 9 further includes a support 24 erected thereon and supporting a decelerating cylinder 25. The decelerating cylinder 25 has a cylinder rod 25a abutting at a forward end thereof upon an upper surface of the weight deck 22. The support 24 includes a stopper 26 for contacting the upper surface of the weight deck 22 to determine a lowermost cleaning position of the cleaning brush 12 covering a range from the center of wafer W to the outer periphery thereof. A micrometer 27 is attached to the stopper 26 for adjusting the lowermost cleaning position.

Figure 4:
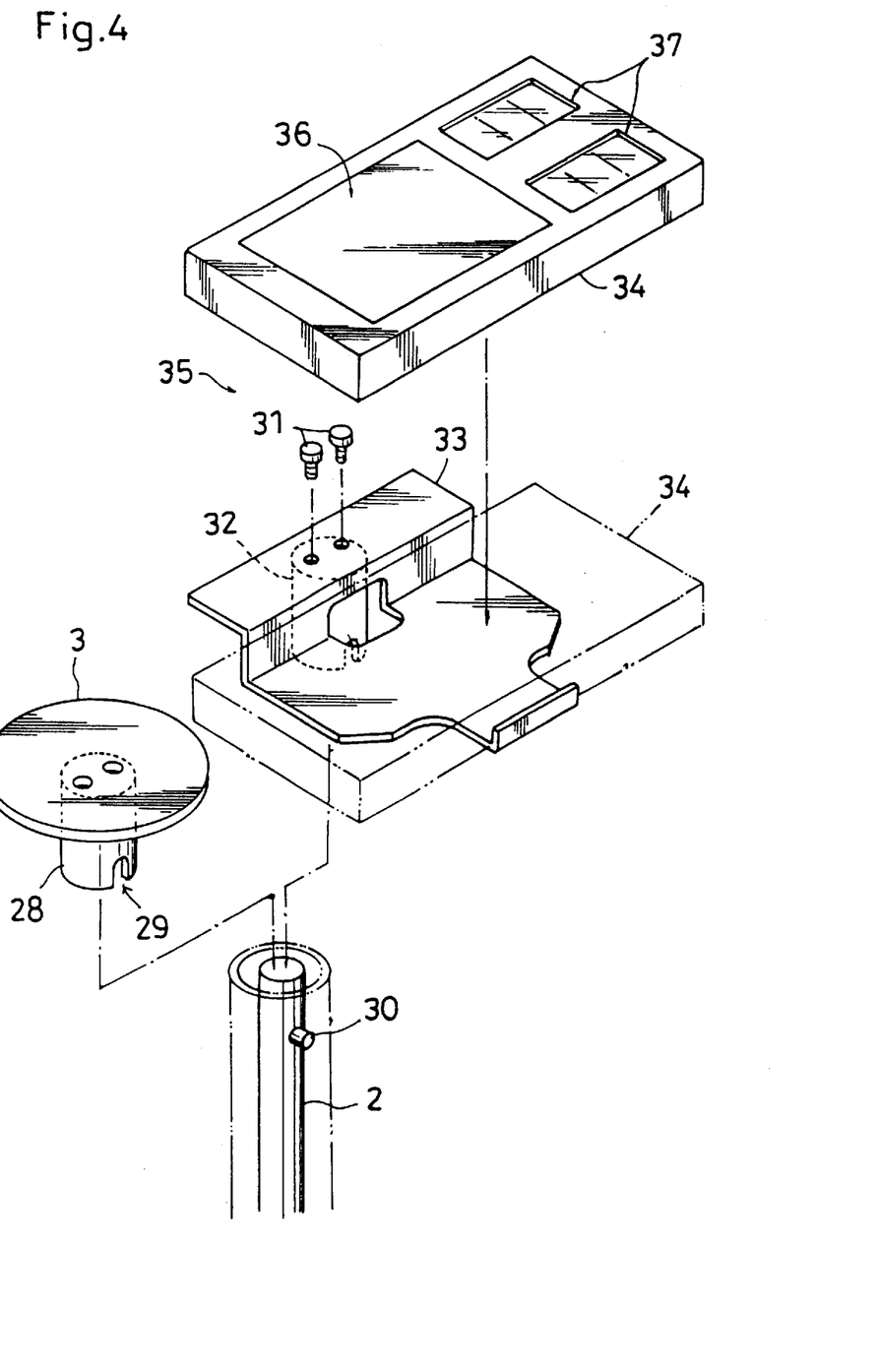
FIG. 4 is an exploded perspective view of a principal portion of the apparatus in the first embodiment.

Referring to FIG. 4, the turntable 3 has a tube 28 extending from a lower surface thereof to fit on the rotary shaft 2. The tube 28 defines a cutout 29 for receiving a positioning pin 30 fixed to the rotary shaft 2. The turntable 3 is fastened in a central region thereof to an upper end of the rotary shaft 2 by a pair of screws 31. In this way, the turntable 3 is detachably attached to the rotary shaft 2.

The turntable 3 is replaceable by a support bracket 33 with a load meter 34 mounted thereon to act as a load measuring device 35. The support bracket 33 has a tube 28 for fitting on the rotary shaft 2, and may be fastened to the rotary shaft 2 by the pair of screws 31. When the cleaning brush 12 is pressed against the load meter 34, the latter measures a pressing load applied from the cleaning brush 12.

The load meter 34 includes a pressure sensor 36 having a load cell (not shown) mounted inside the load meter 34 for receiving and measuring a pressing load applied from the cleaning brush 12, and an indicator 37 for displaying the load measured.

Figure 5A:
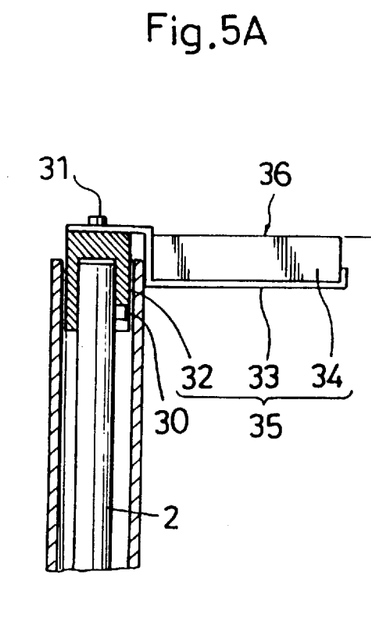
FIG. 5A is a side view of the portion shown in FIG. 4, with a load measuring device mounted in place.
Figure 5B:
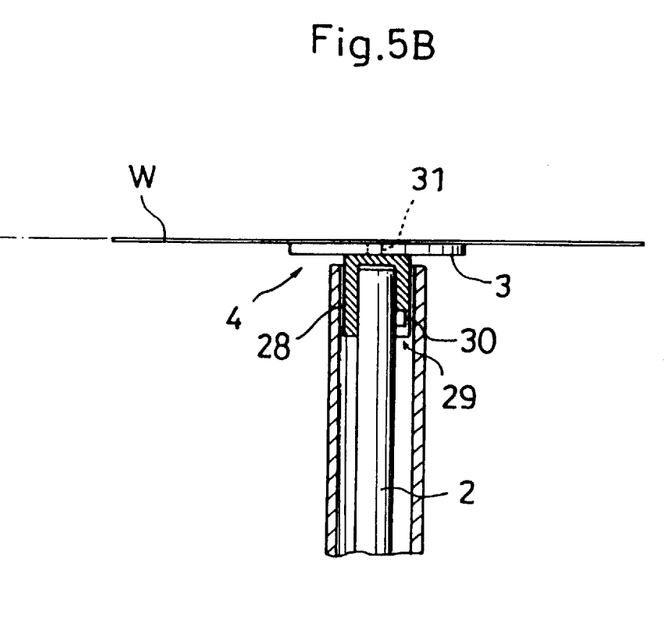
FIG. 5B is a side view similar to FIG. 5A, showing a substrate supported for treatment.

As shown in FIGS. 5A and 5B, when the load measuring device 35 is attached to the rotary shaft 2 (FIG. 5A), the surface of the pressure sensor 36 for receiving the cleaning brush 12 is at a level equal to the surface of wafer W to be supported by the substrate supporting device 4 (FIG. 5B).

With this construction, a method of measuring a load applied from the cleaning brush 12 is executed in the following sequence. The load measuring device 35 is attached to the rotary shaft 2 prior to wafer cleaning treatment. The electric motor 15 is driven to move the cleaning brush 12 to a position over the pressure sensor 36. Next, the cylinder rod of the air cylinder 13 is retracted to lower the cleaning brush 12. The cleaning brush 12 is received by the pressure sensor 36 which then measures a pressing load of the cleaning brush 12. While visually checking the load measured, the operator controls the micrometer 27 to adjust a lowermost position. The adjustment is stopped when a desired pressure is attained, so that the desired pressure may be applied from the cleaning brush 12 to the wafer W.

Figure 6:
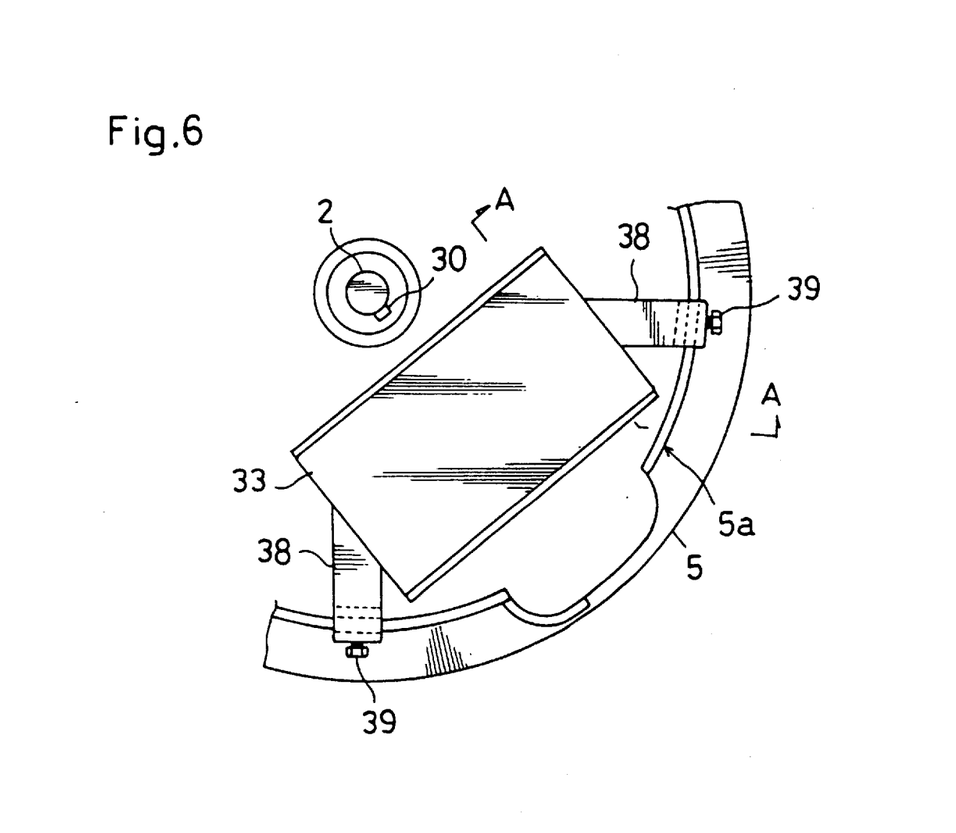
FIG. 6 is a fragmentary plan view of a second embodiment of the present invention.
Figure 7:
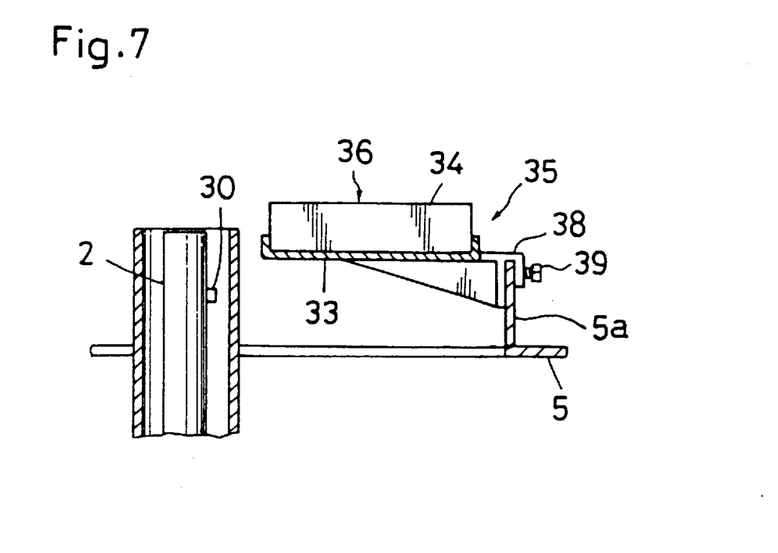
FIG. 7 is a sectional view taken along A—A of FIG. 6.

As shown in FIGS. 6 and 7, a load measuring device 35 may have engaging members 38 extending therefrom to a vertical wall 5a of the cup 5. The engaging members 38 are engageable with the vertical wall 5a from above, to be tightened thereto by screws 39.

The engaging members 38 are fixed to the vertical wall 5a of the cup 5 in a lowermost position, and a load meter 34 is placed on a support bracket 33. In this state, the surface of a pressure sensor 36 for receiving the cleaning brush 12 is at a level equal to the surface of wafer W to be cleaned.

Figure 8:
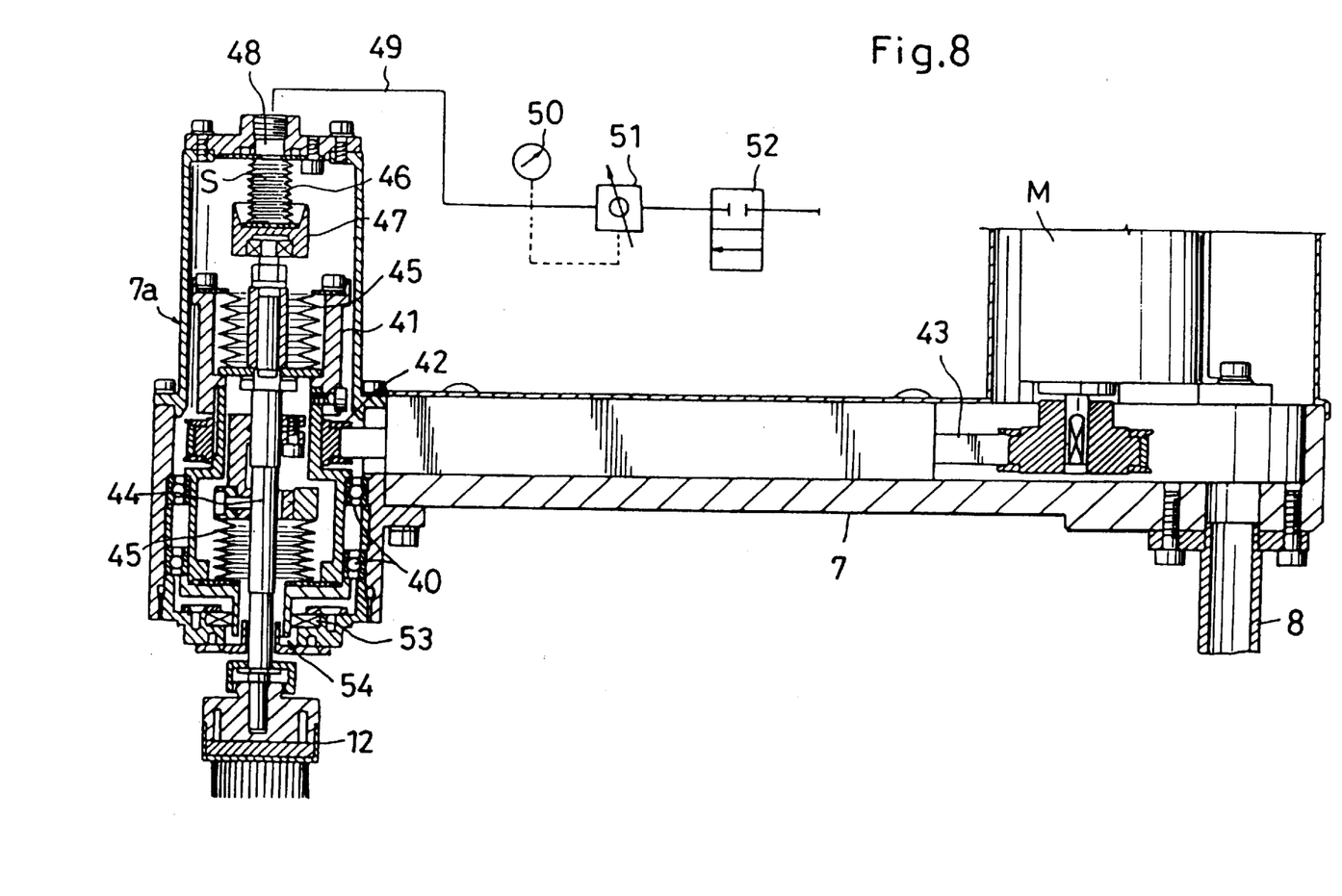
FIG. 8 is an enlarged view in vertical section of a principal portion of a modified pressure setting structure.

Referring to FIG. 8, the forward arm portion 7a has a hollow rotary element 41 mounted therein through bearings 40 to be rotatable about the second axis P2. The rotary element 41 supports a pulley 42 mounted on a longitudinally intermediate portion thereof to be rotatable together. The pulley 42 is operatively connected through a timing belt 43 to an electric motor M mounted on the support arm 7 adjacent the first axis P1.

The cleaning brush 12 is rigidly attached to a cleaner support 44 extending through the rotary element 41. The cleaner support 44 is connected to the rotary element 41 so that they are rotatable together. A first bellows 45 formed of flexible stainless steel extends between an upper position of the cleaner support 44 and an upper end of the rotary element 41 and between a lower position of the cleaner support 44 and a lower end of the rotary element 41.

The forward arm portion 7a further includes a stopper 47 mounted therein and opposed to the upper end of the cleaner support 44. The stopper 47 is connected to the forward arm portion 7a through a second bellows 46 formed of flexible stainless steel. The cleaner support 44 has an upper end thereof fitted in the stopper 47 to be rotatable and vertically movable relative thereto. The forward arm portion 7a, second bellows 46 and stopper 47 in combination define a closed space S. The forward arm portion 7a has a supply/exhaust port 48 formed in an upper end thereof and communicating with the closed space S.

A pressurized air source (not shown) is connected to the supply/exhaust port 48 through air piping 49. The air piping 49 has a pressure gauge 50, a regulator 51 for setting a variable pressure, and a switch valve 52, mounted in intermediate positions thereof. Thus, the pressure in the air piping 49 is automatically maintained within a predetermined range.

The foregoing construction for raising and lowering the cleaner support 44 with the cleaning brush 12 rigidly attached thereto and for raising and lowering the support arm 7 constitute the cleaner raising and lowering device.

A magnetic fluid seal 53 and a labyrinth 54 are disposed between lower positions of the forward arm portion 7a and rotary element 41. These components prevent dust produced by wear of the bearings 40 disposed above from falling on the wafer W, and entry of the cleaning liquid.

The cleaning apparatus having the above construction cleans the surface of wafer W by supplying the cleaning liquid to and pressing the cleaning brush 12 on the wafer surface. If the wafer W is warped, variations occur in the pressure applied from the cleaning brush 12 to the wafer W with spinning of the wafer W and movement of the cleaning brush 12.

For positions of wafer W curved upward, the pressure gauge 50 detects pressures higher than the predetermined range. Then, the regulator 51 is operated to reduce the pressure inside the air piping 49 to the predetermined range, thereby to contract the second bellows 46. As a result, the cleaning brush 12 supported by the cleaner support 44 is raised to maintain the pressure from the cleaning brush 12 to the wafer W within a predetermined range. For positions of wafer W curved downward, the pressure gauge 50 detects pressures lower than the predetermined range. Then, the regulator 51 is operated to increase the pressure inside the air piping 49 to the predetermined range, thereby to expand the second bellows 46. As a result, the cleaning brush 12 supported by the cleaner support 44 is lowered to maintain the pressure from the cleaning brush 12 to the wafer W within the predetermined range.

With the spin cleaning apparatus having such a pressure setting structure as described, the load measuring device 35 is attached to the rotary shaft 2 prior to cleaning treatment of the wafer. The cleaning brush 12 is pressed on the pressure sensor 36 which measures a pressing load applied from the cleaning brush 12. The pressure set by the regulator 51 is varied until the load measured becomes a predetermined value. When the load measured reaches the predetermined value, the pressure then applied is adopted as a pressure to be set by the regulator 51. Subsequently, the load measuring device 35 is replaced by the turntable 3, and wafer W is placed thereon, to carry out normal cleaning treatment of wafer W.

Thus, the predetermined pressure is applied from the cleaning brush 12 to the wafer W regardless of a pressure loss due, for example, to friction between the cleaner support 44 and rotary element 41.

The present invention may be implemented not only where the cleaning brush 12 is a nylon brush or mohair brush, or formed of a soft material such as sponge or felt, but where a plastic brush is employed. These brushes are collectively referred to herein as a cleaning device.

In order to move the cleaning brush 12 horizontally over the surface of wafer W, the support arm 7 is pivotable about the first vertical axis P1 by the electric motor 15. Instead, the support arm 7 may be adapted to be linearly movable by an air cylinder or the like. The combination of support arm 7 and electric motor 15 and the combination of support arm 7 and an air cylinder are collectively referred to herein as a cleaner displacing device.

The tube 32 and support bracket 33, and the engaging members 38 and support bracket 33, for supporting the load meter 34 in the foregoing embodiments are collectively referred to herein as a supporting device.

The present invention is not limited to the substrate spin cleaning apparatus for cleaning circular substrates as described in the foregoing embodiments, but is applicable also to a substrate spin cleaning apparatus for cleaning square substrates.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate spin cleaning apparatus comprising:
    substrate support means for supporting a substrate and spinning said substrate about a vertical axis;
    cleaning means for cleaning a surface of said substrate;
    cleaner displacing means for displacing said cleaning means horizontally over said surface of said substrate;
    cleaner raising and lowering means for vertically moving said cleaning means;
    cleaning liquid supply means for supplying a cleaning liquid to positions of said surface of said substrate under cleaning treatment by said cleaning means; and
    load measuring means for receiving said cleaning means at a level equal to said surface of said substrate supported by said substrate support means, and measuring a pressing load applied from said cleaning means.

2. A substrate spin cleaning apparatus as defined in claim 1, wherein said substrate support means includes a rotary shaft, and said load measuring means includes support means detachably attachable to said rotary shaft of said substrate support means, and a load meter mounted on said support means.

3. A substrate spin cleaning apparatus as defined in claim 2, wherein said rotary shaft includes a positioning pin, and said support means includes a support bracket supporting said load meter, a tube connected to said support bracket to engage said positioning pin of said rotary shaft to be rotatable with said rotary shaft, and screws fastening said tube to said rotary shaft.

4. A substrate spin cleaning apparatus as defined in claim 1, wherein a cup surrounds said substrate support means, and said load measuring means includes support means detachably attachable to said cup surrounding said substrate support means, and a load meter mounted on said support means.

5. A substrate spin cleaning apparatus as defined in claim 4, wherein said cup has a vertical wall, and said support means includes a support bracket supporting said load meter, engaging members connected to said support bracket to engage said vertical wall of said cup, and screws fastening said engaging members to said vertical wall.

6. A substrate spin cleaning apparatus comprising:
    a substrate supporting device supporting a substrate and spinning said substrate about a vertical axis;
    a cleaning device cleaning a surface of said substrate;
    a cleaner displacing device displacing said cleaning device horizontally over said surface of said substrate;
    a cleaner raising and lower device vertically moving said cleaning device;
    a cleaning liquid supply device supplying a cleaning liquid to positions of said surface of said substrate under cleaning treatment by said cleaning device; and
    a load measuring device receiving said cleaning device at a level equal to said surface of said substrate supported by said substrate supporting device, and measuring a pressing load applied from said cleaning device.

7. A substrate spin cleaning apparatus as defined in claim 6, wherein said substrate supporting device includes a rotary shaft, and said load measuring device includes a support frame which is detachably attachable to said rotary shaft of said substrate supporting device, and a load meter mounted on said support frame.

8. A substrate spin cleaning apparatus as defined in claim 7, wherein said rotary shaft includes a positioning pin, and said support frame includes a support bracket supporting said load meter, a tube connected to said support bracket to engage said positioning pin of said rotary shaft to be rotatable with said rotary shaft, and fasteners to fasten said tube to said rotary shaft.

9. A substrate spin cleaning apparatus as defined in claim 6, wherein a cup surrounds said substrate supporting device, and said load measuring device includes a support frame which is detachably attachable to said cup surrounding said substrate supporting device, and a load meter mounted on said support frame.

10. A substrate spin cleaning apparatus as defined in claim 9, wherein said cup has a vertical wall, and said support frame includes a support bracket supporting said load meter, engaging members connected to said support bracket to engage said vertical wall of said cup, and fasteners fastening said engaging members to said vertical wall.

11. A substrate spin cleaning apparatus as defined by claim 6, wherein said cleaning device is a cleaning brush.

* * * * *